US011139186B2

(12) United States Patent
McBriarty et al.

(10) Patent No.: US 11,139,186 B2
(45) Date of Patent: Oct. 5, 2021

(54) THIN FILM DEPOSITION IN A HIGH ASPECT RATIO FEATURE

(71) Applicant: Intermolecular, Inc., San Jose, CA (US)

(72) Inventors: Martin E. McBriarty, San Jose, CA (US); Karl A. Littau, Palo Alto, CA (US)

(73) Assignee: INTERMOLECULAR, INC., San Jose, CA (US)

(*) Notice: Subject to any disclaimer, the term of this patent is extended or adjusted under 35 U.S.C. 154(b) by 56 days.

(21) Appl. No.: 16/714,934

(22) Filed: Dec. 16, 2019

(65) Prior Publication Data
US 2021/0183674 A1    Jun. 17, 2021

(51) Int. Cl.
*H01L 21/67* (2006.01)
*H01L 21/66* (2006.01)

(52) U.S. Cl.
CPC ........ *H01L 21/67253* (2013.01); *H01L 22/12* (2013.01); *H01L 22/14* (2013.01); *H01L 22/32* (2013.01); *H01L 22/34* (2013.01)

(58) Field of Classification Search
None
See application file for complete search history.

(56) References Cited

U.S. PATENT DOCUMENTS

2017/0299438 A1* 10/2017 Weiler ............... G01J 5/046

* cited by examiner

*Primary Examiner* — Alexander G Ghyka
(74) *Attorney, Agent, or Firm* — Hunter Clark PLLC

(57) ABSTRACT

Techniques for creating a high aspect feature and testing the efficacy of a gas-phase deposition process are provided. An example of a method for thin film deposition in a high aspect ratio feature includes preparing a first substrate for a material deposition process, depositing a plurality of spacers on a top surface of the first substrate, disposing a bottom surface of a second substrate on the plurality of spacers, and performing a gas-phase material deposition on the first substrate and the second substrate.

11 Claims, 7 Drawing Sheets

THIN FILM DEPOSITION IN A HIGH ASPECT RATIO FEATURE

BACKGROUND

Deposition processes are commonly used in semiconductor manufacturing to deposit a layer of material onto a substrate. Processing is also used for removing layers, defining features (e.g., etch), preparing layers (e.g., cleans), doping, or other processes that do not require the formation of a layer on the substrate. Similar processing techniques may also apply to the manufacture of integrated circuits (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. Semiconductor companies often conduct R&D on full wafer processing through the use of split lots, as the deposition systems are designed to support this processing scheme. This approach has resulted in ever escalating R&D costs and the inability to conduct extensive experimentation in a timely and cost effective manner.

In addition to shrinking feature sizes, semiconductor device architecture is migrating from two-dimensional (2D) designs to stacked three-dimensional (3D) designs. These newer 3D device designs often rely on gas-phase materials deposition into nanoscale features with high aspect ratios, including trenches and cylindrical vias. The performance of these devices depends on the consistency of material properties, such as thickness, composition, and defect density, throughout the high aspect ratio feature. However, probing these features in nanoscale devices is limited by inadequate resolution of metrology capabilities and the costs of producing an experimental series of nanoscale devices.

SUMMARY

An example of a method for thin film deposition in a high aspect ratio feature according to the disclosure includes preparing a first substrate for a material deposition process, depositing a plurality of spacers on a top surface of the first substrate, disposing a bottom surface of a second substrate on the plurality of spacers, and performing a gas-phase material deposition on the first substrate and the second substrate.

Implementations of such a method may include one or more of the following features. The method may further include removing the second substrate and the plurality of spacers from the top surface of the first substrate, and performing one or more metrology tests on a film gradient formed on the top surface of the first substrate. The one or more metrology tests may include at least one of ellipsometry, X-ray reflectivity, X-ray diffraction, optical spectroscopy, scanning probe microscopy, X-ray fluorescence, energy-dispersive X-ray spectroscopy, and X-ray photoelectron spectroscopy. The method may further include removing the second substrate and the plurality of spacers from the top surface of the first substrate, depositing a pattern of electrical contacts on a film gradient formed on the top surface of the first substrate, and performing one or more electrical tests along the film gradient with the pattern of electrical contacts. The plurality of spacers may be a plurality of spheres. A diameter of each of the plurality of spheres may be approximately equal and in a range of 10 to 100 microns. The first substrate may be an area on a test wafer. The first substrate may be a coupon measuring approximately 40-50 mm in length and width. The first substrate may be disposed on a test wafer including a plurality of coupon holders configured to hold the first substrate and the second substrate in a position on the test wafer. The first substrate may be comprised of at least one of pure silicon, doped silicon, germanium, glass, quartz, sapphire, and a III-V semiconductor. Preparing the first substrate for the material deposition process may include coating the first substrate with an insulator, a semiconductor, or a conductor. Performing the gas-phase material deposition on the first substrate and the second substrate may include performing an atomic layer deposition process.

An example of a high aspect ratio semiconductor device according to the disclosure includes a first planar substrate, a plurality of microbeads disposed on at least a first portion of a top surface of the first planar substrate, and a second planar substrate including a bottom surface disposed on the plurality of microbeads, wherein a gap is formed between a second portion of the top surface of the first planar substrate and the bottom surface of the second planar substrate.

Implementations of such a high aspect ratio semiconductor device may include one or more of the following features. The first planar substrate may be comprised of at least one of pure silicon, doped silicon, germanium, glass, quartz, sapphire, and a III-V semiconductor. A diameter of each of the plurality of microbeads may be approximately equal and in a range of 10 to 100 microns. The first planar substrate and the second planar substrate may be coupons measuring approximately 40-50 mm in length and width. The first planar substrate may be a test wafer and the second planar substrate is a coupon measuring approximately 40-50 mm in length and width. The first planar substrate may be coated with an insulator, a semiconductor, or a conductor. The plurality of microbeads may be composed of silica or alumina.

An example of an apparatus for testing a gas-phase material deposition process according to the disclosure includes means depositing a plurality of spheres on a top surface of a first substrate, means for disposing a bottom surface of a second substrate on the plurality of spheres, and means for performing a gas-phase material deposition on the first substrate and the second substrate.

Items and/or techniques described herein may provide one or more of the following capabilities, as well as other capabilities not mentioned. A high aspect ratio trench may be composed of two parallel flat surfaces separated by spacers. The two parallel flat surfaces are subjected to a gas-phase thin film deposition. After deposition, one flat surface is removed from the assembly and measurement of the properties of the deposited film may be obtained. The high aspect ratio trench assembly described herein enables the study of materials deposition into high aspect ratio features at scales accessible to standard metrology instruments and electrical testing using contact arrays which do not require complex lithography. Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

DETAILED DESCRIPTION

Figure 1:
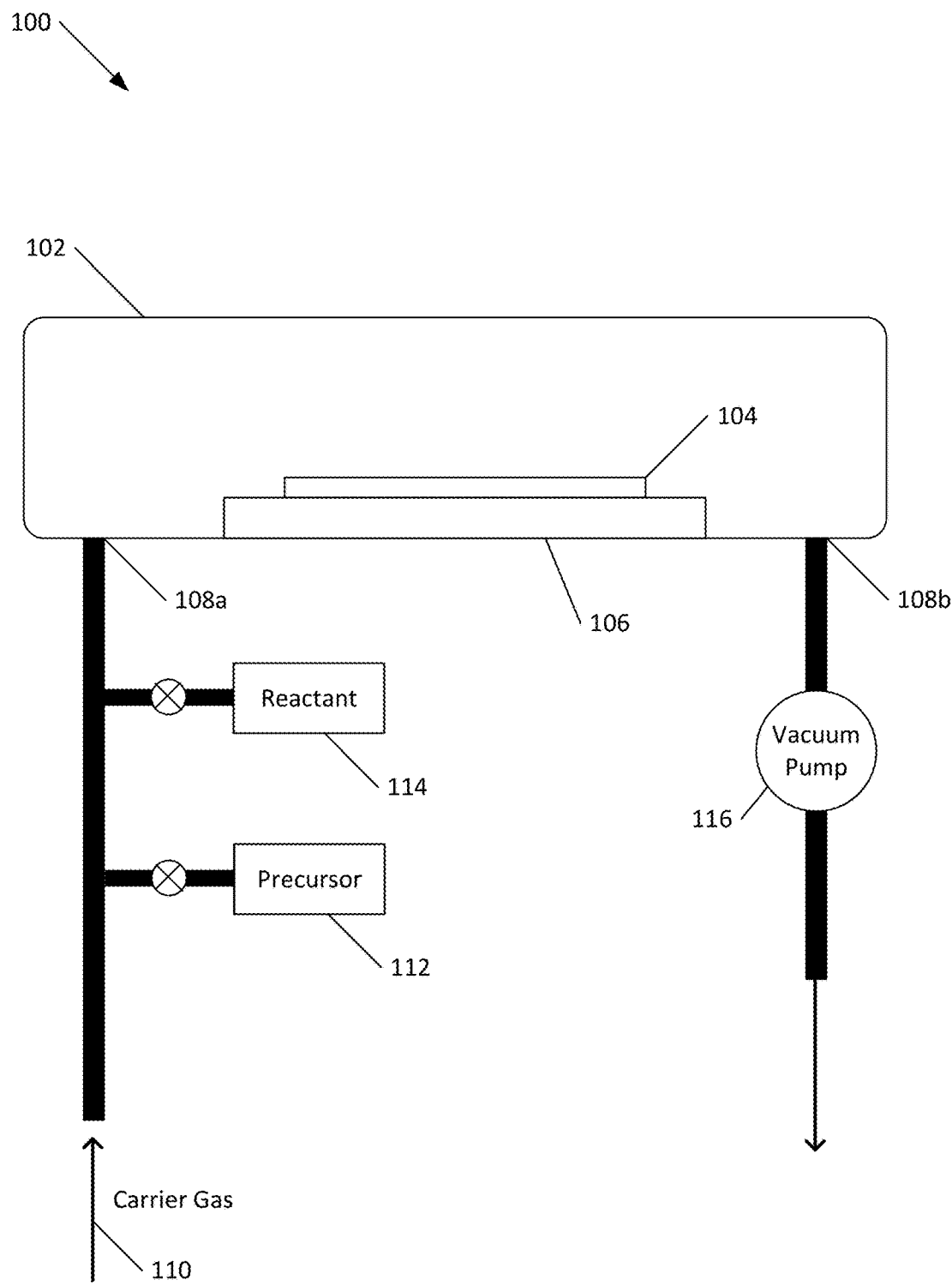
FIG. 1 is a schematic of an example of a system for gas-phase material deposition.

Techniques are discussed herein for creating a high aspect feature and testing the efficacy of a gas-phase deposition process. For example, two flat surfaces may be stacked together and separated by spacers. The surfaces may be composed of a flat material, such as a silicon wafer. At least one of the two surfaces may be considered as the substrate for a thin film deposition process. The substrate may consist of a bulk material (e.g., pure or doped silicon, germanium, a III-V semiconductor, glass, quartz, sapphire, etc.) which may be coated with an insulator (e.g. silicon oxide, silicon nitride, aluminum oxide, hafnium oxide, etc.), semiconductor (e.g. polycrystalline silicon), conductor (e.g. platinum, gold, titanium nitride, etc.) or another material. The spacers may be composed of beads (e.g., microbeads) which are compatible with the thin film deposition conditions and will not contaminate the substrate or deposited material. The beads may be composted of silica, alumina, or other materials of appropriate hardness, temperature resistance, and chemical inertness. The thin film deposition process and spacer size may be tuned to operate in or near the molecular flow regime (i.e., the mean free path of reactant gas molecules may be larger than the spacing between surfaces) for comparison with thin film deposition conditions in nanoscale devices. The thin film deposition process and spacer size may also be tuned to control the extent of deposition of the film into the high aspect ratio space. Because of limitations in thin film deposition (e.g. gas diffusion, reactant dose, surface chemistry, etc.), a gradient of the film properties (e.g. thickness, composition, defect density, etc.) may result. Metrology (e.g. ellipsometry, X-ray diffraction, X-ray reflectivity, X-ray fluorescence, energy-dispersive X-ray spectroscopy, X-ray photoelectron spectroscopy, optical spectroscopy, scanning probe microscopy) may be performed along the film gradient. Electrical contacts may be deposited onto the film in a pattern to form devices (e.g. metal-insulator-metal capacitor structures or metal-insulator-semiconductor structures), enabling electrical testing across the film gradient. These techniques are examples only, and not exhaustive.

In operation, the resulting thin film gradient enables the study of changes in the properties of thin films across a film gradient caused by limitations in thin film deposition in high aspect ratio spaces. Such testing may provide insight into the physical and functional properties of thin films deposited in high aspect ratio spaces. These test results may otherwise not be available for real nanoscale devices because standard metrological instruments often cannot access the corresponding small device size and device geometry. Physical properties which may change along the film gradient and may be measured on the proposed thin film gradient using standard laboratory metrology tools (i.e., with probe sizes on the order of tens to hundreds of microns or larger). For example, the properties such as film thickness (e.g., ellipsometry, X-ray reflectivity), crystal structure (e.g., X-ray diffraction, optical spectroscopy), crystallite size (e.g., X-ray diffraction, scanning probe microscopy), and composition (e.g., X-ray fluorescence, energy-dispersive X-ray spectroscopy, X-ray photoelectron spectroscopy) may be measured. Electrical contacts may be deposited in a pattern that spans the thin film gradient and the functional or electronic properties of the thin film (e.g. dielectric constant, breakdown, charge trapping properties, ferroelectric properties, etc.) may be measured across the gradient. The method is compatible with gas-phase materials deposition processes. The method is low cost and simple to assemble, an advantage over existing methods which require complex assembly and/or etching/deposition processes to define a trench. The use of monodisperse microbead spacers provides a more reliable trench offset than shims, which may warp, particularly at high temperatures. The size of the high aspect ratio space may be modified by choice of spacer to achieve materials deposition in the gas flow regime of interest or to achieve materials deposition across a desired lateral distance on the substrate.

Referring to FIG. 1, a schematic of an example system 100 for gas-phase material deposition is shown. The system 100 is an example of a cross flow Atomic Layer Deposition (ALD) system. The system 100 is only an example and not a limitation as other commercial and proprietary systems such as Physical Vapor Deposition (PVD), Chemical Vapor Deposition (CVD), Low Pressure Chemical Vapor Deposition (LPCVD), Plasma-Enhanced Chemical Vapor Deposition (PECVD), Plasma-Enhanced Atomic Layer Deposition (PEALD), Metal-Organic Chemical Vapor Deposition (MOCVD), and other gas-phase processes may be used. In addition, other configurations of ALD systems such as a showerhead configuration where the vapor inlet is a plurality of holes distributed above the substrate and exhaust is distributed around the substrate periphery may also be used. In an example, the system 100 may be a flow reactor including a process chamber 102, a substrate 104 (e.g., an object to receive a thin film coating), and a stage 106 configured to support the substrate 104. The process chamber 102 is configured to maintain a vacuum pressure and includes an inlet port 108a and an exhaust port 108b. A vacuum pump 116 is configured to create a vacuum (e.g., approximately 1.0 torr) within the chamber 102 and enable a flow of process gases over the substrate 104. The process gases may be a carrier gas 110 (e.g., Nitrogen) with precursor and ligand-removal reagents, generally labeled as a precursor 112 and a reactant 114. The carrier gas 110 may also be used to purge the chamber 102 between process steps. In operation, the stage 106 may be configured to heat the substrate 104 to approximately 60 to 750 degrees Celsius. Other heating elements (not shown in FIG. 1) may also be used to heat the process chamber 102 to a desired process temperature. Other heating elements (not shown in FIG. 1) may also be used to heat the carrier gas 110, precursors 112, reactants 114, and associated gas lines to a desired temperature. In an example, the carrier gas 110 may flow into the chamber at a rate of approximately 400-2000 mL/min and provide a linear gas velocity of 2.5-10.0 m/s. Other flow rates and corresponding velocities may be used. Precursors 112 and reactants 114 (e.g., ligand-removal reagents) may be inserted into the carrier gas 110 based on process requirements. The composition of the precursors 112, reactant 114, as well as the gas flow rates, substrate/chamber temperature, and chamber pressure may be varied to change the properties on the resulting thin film deposited on the substrate 104.

While the system 100 depicts a single process chamber 102, the methods and devices described herein are not so limited. The system 100 may include a plurality of process chambers and may be configured for combinatorial processing. For example, a combinatorial process system such as described in U.S. Pat. No. 8,932,995, filed on Dec. 21, 2011, and titled "Combinatorial Process System" may be used. In an example, a quadrant-based ALD chamber may be used. Other combinatorial platforms and multi-process systems may also be used.

Figure 2:
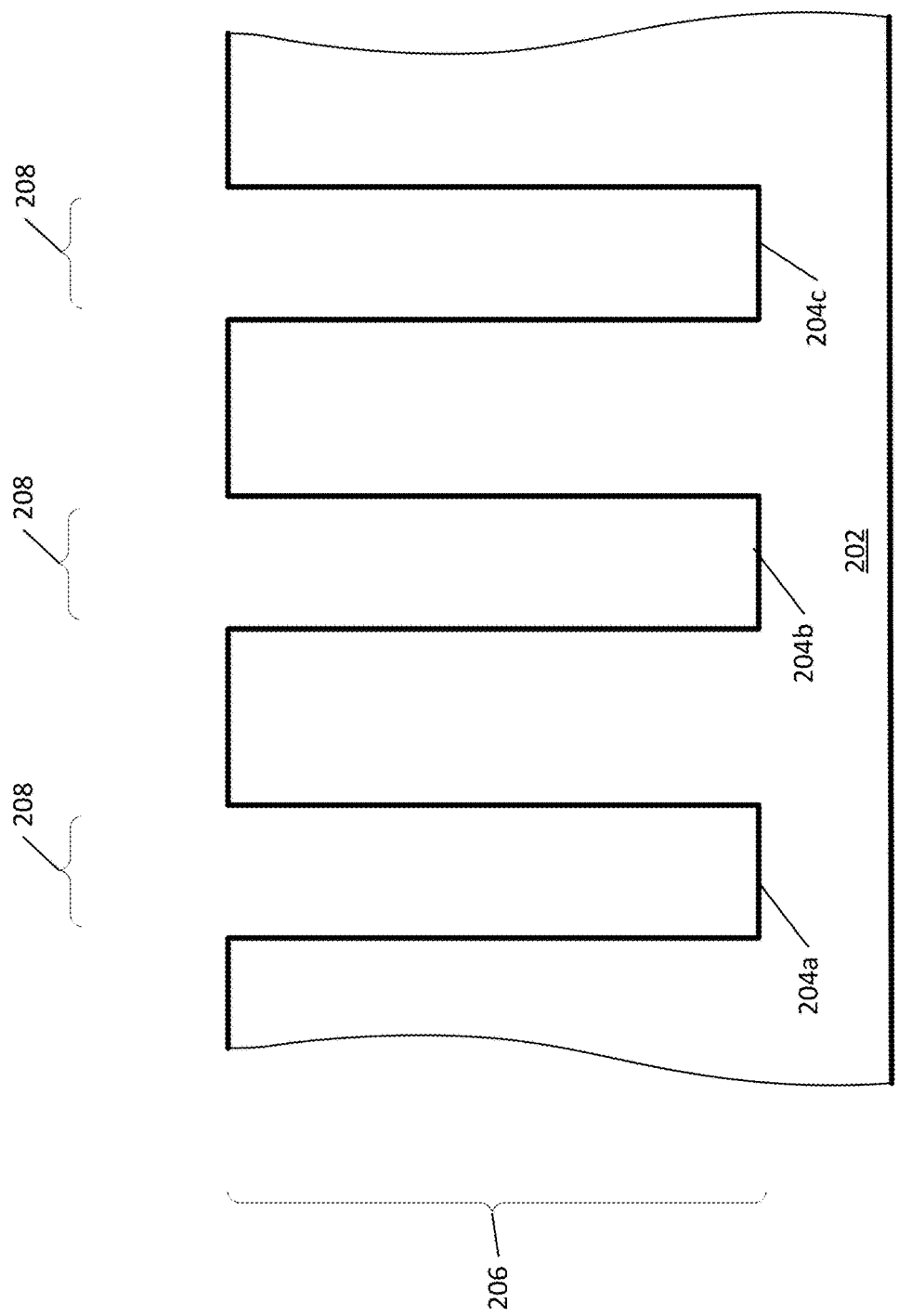
FIG. 2 is an example substrate with high aspect features.

Referring to FIG. 2, an example substrate 202 with high aspect ratio features 204a-c is shown. The substrate 202 may be a silicon wafer and the high aspect ratio features 204a-c may be etched into the substrate 202 via a prior etching process. Other substrates and processes may also be used to generate the high aspect ratio features 204a-c. While FIG. 2 depicts three simple examples of high aspect ratio features 204a-c, the number and configurations of the features are not so limited. In a 3D NAND Flash memory device, for example, the high aspect ratio features 204a-c may be etched into a multilayer stack of insulating layers alternating with semiconducting or conducting layers. The inside of the high aspect features in a 3D NAND Flash memory device may be coated with a tunneling layer, a charge trap layer, a charge blocking layer, a channel layer, and/or a conducting gate layer. In a typical 3D NAND Flash memory device, the high aspect ratio features 204a-c have a height 206 to width 208 ratio of approximately 40 to 60, but the ratio is expected to exceed 100 for future devices as the bit density in the devices increases. These high aspect features 204a-c present processing problems to ensure the thicknesses and properties of the thin films deposited on and in the recesses of the high aspect features 204a-c are uniform throughout the height 206 of the feature. Given the typical dimensions of the feature widths 208 are 10-100 nanometers, it may impossible to verify the physical properties on an actual device because the required test equipment may not be capable of performing tests on such small devices. Further, it may take weeks to complete a device and the corresponding electrical tests to determine if a device which relies on a thin film deposited in a high aspect feature is performing as expected. The method and devices described herein provide for creating cost effective high aspect features on a macroscale, which may then be tested with existing metrology and electrical test equipment. The process variables and corresponding test results determined on the macro scale may be utilized to obtain similar physical and electrical properties for thin films in the nanoscale and thus be applicable for use on production devices such as depicted in FIG. 2.

Figure 3:
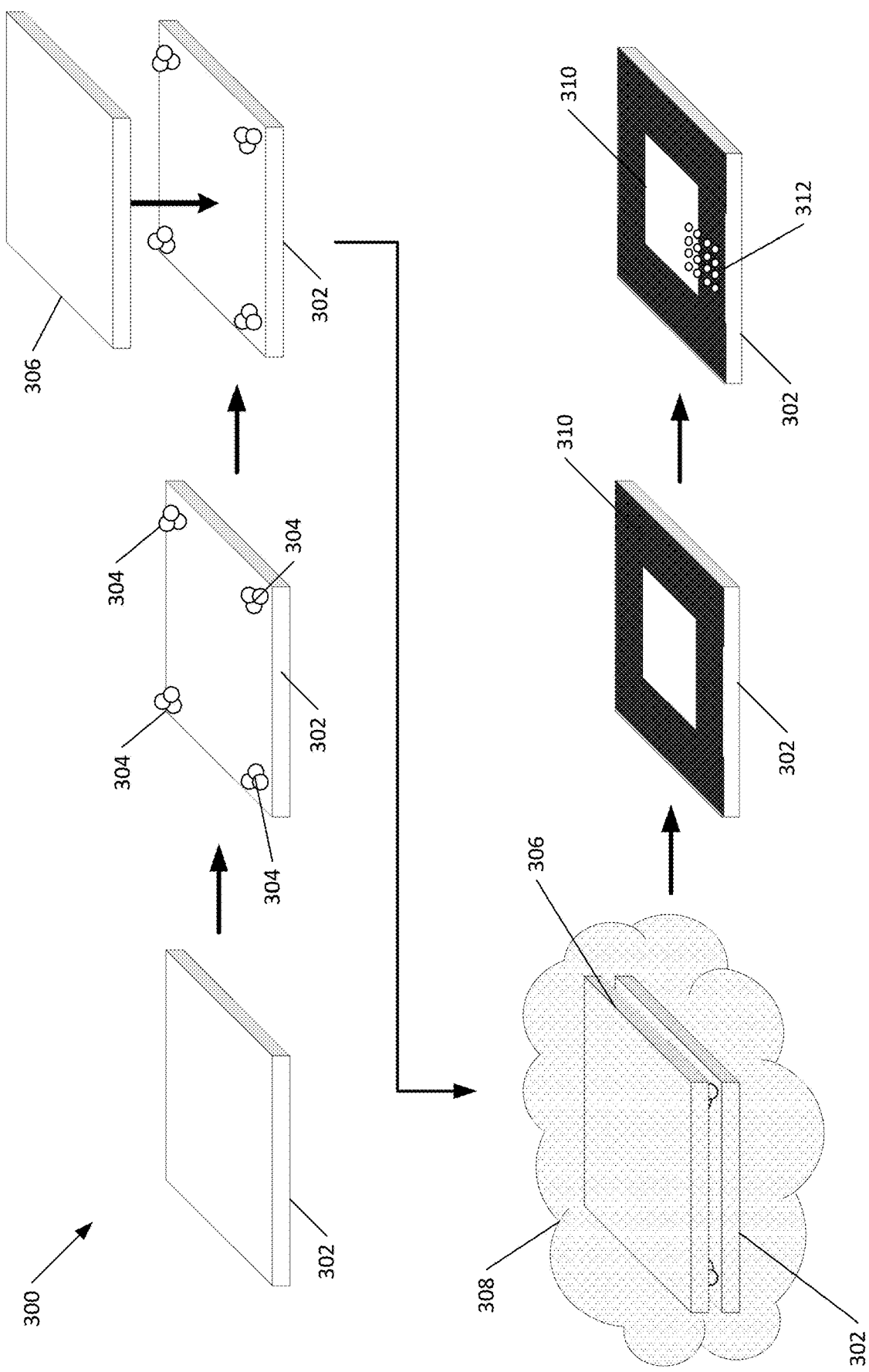
FIG. 3 is an example process for thin film deposition in a high aspect ratio feature.

Referring to FIG. 3, a process 300 for thin film deposition in a high aspect ratio feature is shown. The process begins with a first substrate 302. In an example, the first substrate 302 may be a test coupon prepared to simulate the state of a silicon wafer in a processing recipe. That is, the substrate may be a raw silicon or silicon-germanium material such as at the start of a semiconductor processing recipe, or the first substrate may include doped regions (e.g., results of an ion implant or diffusion process), a metal or oxidation coating, or other surface preparations which may recreate the state of a production wafer or the wall of a high aspect ratio feature prior to a gas-phase deposition process. In an example, the first substrate 302 may be a test coupon approximately 40-50 mm square and 700 microns thick. Other size coupons may also be used. For example, the first substrate 302 may be an area (e.g., 45 mm square) defined on a test wafer (e.g., 200 mm, 300 mm).

A plurality of spacers 304 are deposited on a top surface of the first substrate 302. In an example, the first substrate is planar and the spacers 304 may be deposited on the corners of the top surface of the first substrate 302. The spacers 304 may be microspheres (e.g., microbeads) composed of silica, alumina, or another material with appropriate hardness, temperature resistance, and chemical inertness, typically of a size ranging from approximately 10 to 100 microns in diameter. For example, the spacers 304 may be the silica spheres manufactured by Corpuscular Inc. A specific size of spacers 304 (e.g., 20, 30, 50, 80 microns, etc.) may be combined with isopropyl alcohol in a 1:1 ratio to form a slurry, and 2-5 microliters of the slurry may be transferred via a pipette to each of the corners of the first substrate 302. Other slurry compositions, ratios, and volumes may also be used to deposit a plurality of spacers 304 on the corners, or other regions, of the top surface of the first substrate 302. Alternatively, the spacers may be dispersed in a volatile solvent such as isopropyl alcohol, acetone, water, or ethanol and spray coated in a sparse layer over at least a portion of the substrate by means of an aspiration air brush or other spray coating technique. The spacers should be coated in a sparse enough coating so as not to interfere with the subsequent vapor deposition, typically less than 100 spacers per $mm^2$ and preferably less than 10 spacers per $mm^2$.

A second substrate 306 may be disposed such that a bottom surface of the second substrate 306 is in contact with the spacers 304. The second substrate 306 may be a second planar test coupon with approximately the same dimensions as the first substrate 302. When the spacers 304 are spheres, a light pressure and circular motion may be applied to ensure the spacers 304 spread to a monolayer, resulting in a gap between the top surface of the first substrate 302 and the bottom surface of the second substrate 306 that is equal to size of the individual spacers 304. The gap may exist for a portion of the area between first and second substrates 302, 306 where the spacers 304 are not present. In general, due to the small size of the spacers 304, the gap is present over a substantial area between the two substrates. The stack of the first substrate 302, the spacers 304, and the second substrate 306 are a model of a high aspect ratio semiconductor device prior to thin film deposition.

The first and second substrates 302, 306, and the spacers 304, are subjected to a gas-phase deposition process 308. For example, the substrates 302, 306 may be disposed in the process chamber 102 in the example system 100. The process variables such as precursor 112 and reactant 114 composition, carrier gas 110 flow rate, chamber temperature, pressure, and processing time may be set to values that may be used in a device processing recipe. This recipe may be qualified for regular (i.e. "blanket") thin film deposition using only substrate 302, with no further assembly of the high aspect ratio device, as substrate 104 in the system 100. In general, the chamber 102 operates with a vacuum pressure which enables the gas molecules flowing into the macroscale high aspect features created between the first and second substrates 302, 306 to flow within the Knudsen flow regime. That is, the vacuum enables the gas flow physics associated with the gas-phase deposition process 308 to be nearly the same when used on a production devices with nanoscale high aspect features (e.g., as depicted in FIG. 2).

The first and second substrate 302, 306 may be removed from the gas-phase deposition process 308, and the second substrate 306 and the spacers 304 may be removed from the top surface of the first substrate 302. The resulting thin film 310 extends inward in a gradient from the edge towards the center of the first substrate 302. The thin film 310 typically may extend in 10-15 mm from the edge of the first substrate 302. The extension of the film toward the center of the first substrate 302 may be modified by changing process conditions, such as the dose time of precursor 112. Limited extension of the film toward the center of the first substrate 302 may be desirable to prevent overlap of the film extending from different sides of the substrate. One or more metrology tests may be performed on the thin film 310. For example, ellipsometry with probe sizes in the range of 100-200 microns may be used to measure film thickness and the refractive index at different points along the thin film gradient. X-ray Photoelectron Spectroscopy (XPS) may be used measure the composition, oxidation state, and/or chemical state of the thin film 310 at various points. In such XPS test, the relative concentrations of the elements in a dielectric, semiconductor, metal, or other film may be ascertained.

An array of electrical contacts 312 may be disposed on the thin film 310 extending across and beyond the length of gradient. The array of electrical contacts 312 may compose the top electrodes of small electrical devices (e.g. metal-insulator-metal capacitor structures or metal-insulator-semiconductor structures) used for electrical testing of the gradient of the thin film 310. In general, the size of each of the contact pads in the array of electrical contacts 312 is typically in the range of 100-500 microns and spaced 200-1200 microns from one another. The contact pads may be arranged in parallel rows which are staggered along the direction of the gradient. For example, three rows of contact pads of diameter 200 microns may be spaced so their centers are 1200 microns apart along the direction of the gradient. These rows may be spaced 1000 microns apart in the direction perpendicular to the gradient, and the rows may be offset along the gradient such that one row is displaced 400 microns along the gradient, and a second row is displaced 800 microns along the gradient, relative to a third row. Electrical test tools may be used to probe the performance of the thin film 310 as a function of distance from the edge of the first substrate 302. The results of the electrical tests at various thicknesses (i.e., different distances from the edge) on the thin film 310 may be compared to the expected results for a thin film with a uniform thickness (i.e., created via an open face "blanket" deposition as described above). That is, the results of the electrical test may be used to determine if there are changes in performance in the thin film 310 in the high aspect feature as compared to a coating of equivalent thickness on a featureless substrate. The high aspect feature created by the first and second substrates 302, 306 and the spacers 304 enables a low cost and expedient method for testing the viability of a gas-phase deposition process because the quality of the thin film 310 may be evaluated at the macroscale using standard test equipment, and the corresponding gas-phase deposition process parameters may be tuned to deposit the nanoscale features in production devices.

Figure 4:
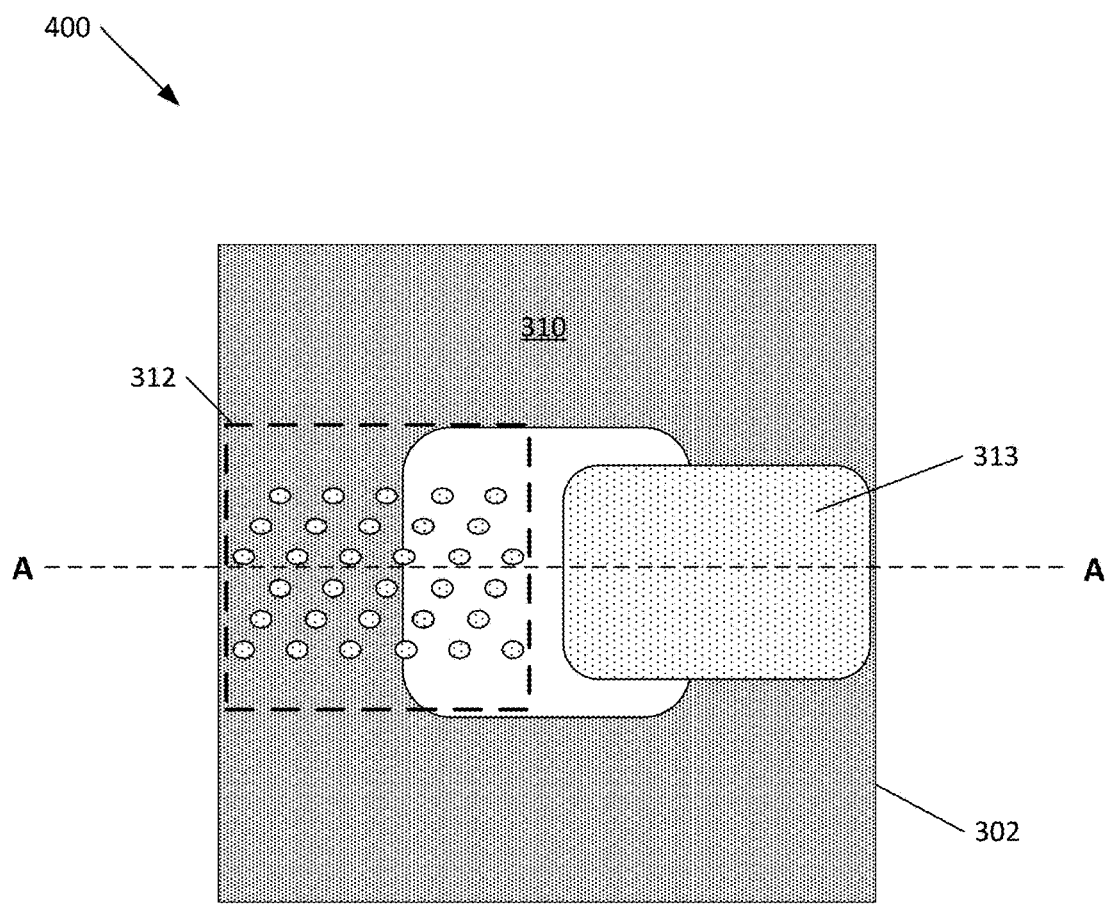
FIG. 4 is an example test coupon with an array of electrical test pads disposed on a deposited thin film gradient.
Figure 4:
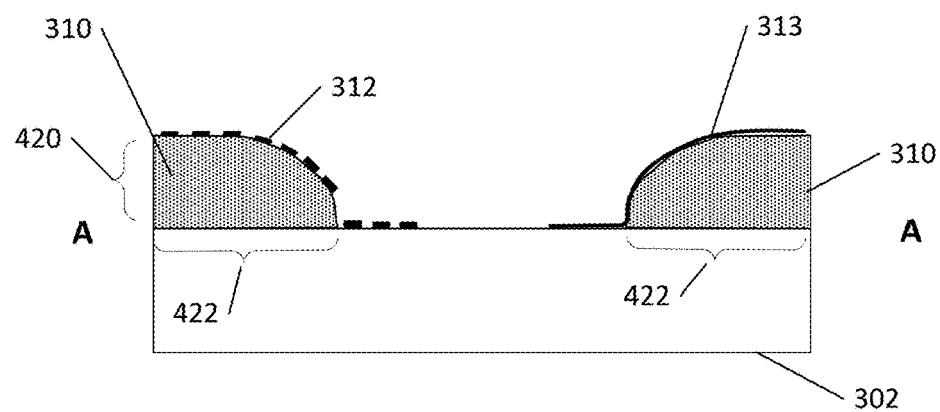

Referring to FIG. 4, with further reference to FIG. 3, an example test coupon 400 with an array of electrical contacts 312 (e.g., test pads) disposed on a deposited thin film 310 is shown. The test coupon 400 may be the first substrate 302 depicted in FIG. 3 after the gas-phase deposition process 308. In an example, a ground pad 313 may be deposited on the thin film 310 with the array of electrical contacts 312 to be used during electrical testing of the thin film 310. A side view along the plane labeled 'A' in FIG. 4 is presented to illustrate the gradient of the thin film 310 as it extends in from the edges of the first substrate 302. A film thickness 420 is exaggerated in FIG. 4 to facilitate the explanation of the gradient of the thin film 310. As depicted in FIG. 4, the film thickness 420 generally decreases as the film proceeds from the edge to the center of the first substrate 302. In an example, the first substrate is approximately 40-50 mm across and the thin film 310 extends in towards the center for a depth 422 of approximately 10-15 mm. The depth 422 may be varied based on the size of the spacers 304 and precursor dose time in the gas-phase deposition process 308. The array of electrical contacts 312 and the ground pad 313 may be used with commercially available probing systems, such as the Cascade PM300, to measure the electrical properties such as sheet resistance, DC I-V/C-V, pulse I-V, and polarization (P-V). The test pads (e.g., contacts) in the array of electrical contacts 312 are typically 100-500 microns in size and spaced between 200-1200 microns apart. The size and spacing of the test pads may vary based on the method of test pad deposition and the capabilities of the electrical probing system. The electrical tests may be used to detect variations, if any, between the performance of the thin film 310 at points along the gradient and the expected performance for a standard thin film (e.g., obtained via an open face deposition). The array of electrical contacts 312 may form the top contacts of devices (e.g. metal-insulator-metal capacitor structures or metal-insulator-semiconductor structures) to facilitate the electrical testing. The process parameters for the gas-phase deposition process 308 may be adjusted based on the detected variations.

Figure 5A:
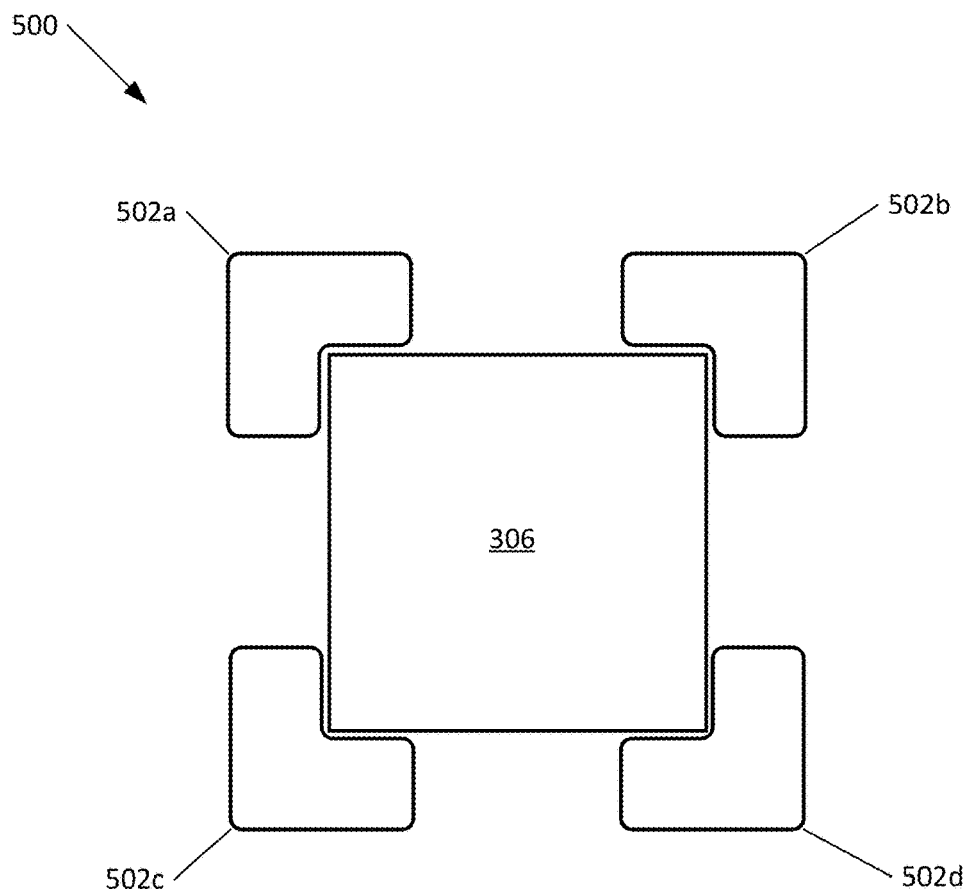
FIGS. 5A and 5B are respective top and side views of an example coupon holder assembly.
Figure 5B:
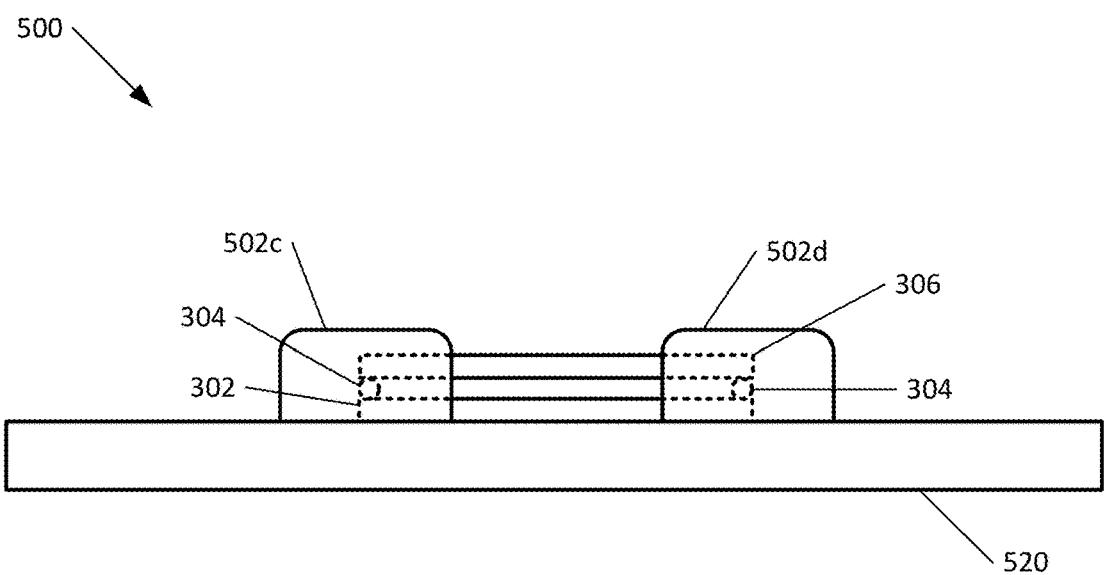

Referring to FIGS. 5A and 5B, with further reference to FIG. 3, a top view and a side view of an example coupon holder assembly 500 are shown. The coupon holder assembly 500 is an example and not a limitation. Other mechanical devices may be used to secure the first and second substrates 302, 306 and the spacers 304 during a gas-phase deposition process. In an example, the coupon holder assembly 500 may include a plurality of corner holders 502a-d configured to secure the substrates 302, 306 in place. The corner holders 502a-d may be disposed at appropriate positions on a test wafer 520. In an example, the corner holders 502a-d may be affixed to the test wafer 520 with an adhesive. In another example, the test wafer 520 may be fabricated with the corner holders 502a-d. In an example, corner holders 502a-d may be a plurality of posts configured to limit lateral movement of the substrates 302, 306 along the surface of the test wafer 520. The corner holders 502a-d are disposed near the corners of the substrates 302, 306 to allow process gases to enter the high aspect feature created by the spacers 304. The corner holders 502a-d are of sufficient height to limit the mobility of the first and second substrates 302, 306. In an embodiment, the corner holders 502a-d may have enough height for additional substrates and spacers to be disposed on top of the second substrate 306 (e.g., a second set of spacers disposed on the top side of the second substrate 306, and a third substrate disposed on the second set of spacers, and etc.). Alternatively, spring clips or other mechanical features may be used to forcibly clamp the second substrate to the first substrate.

Figure 5C:
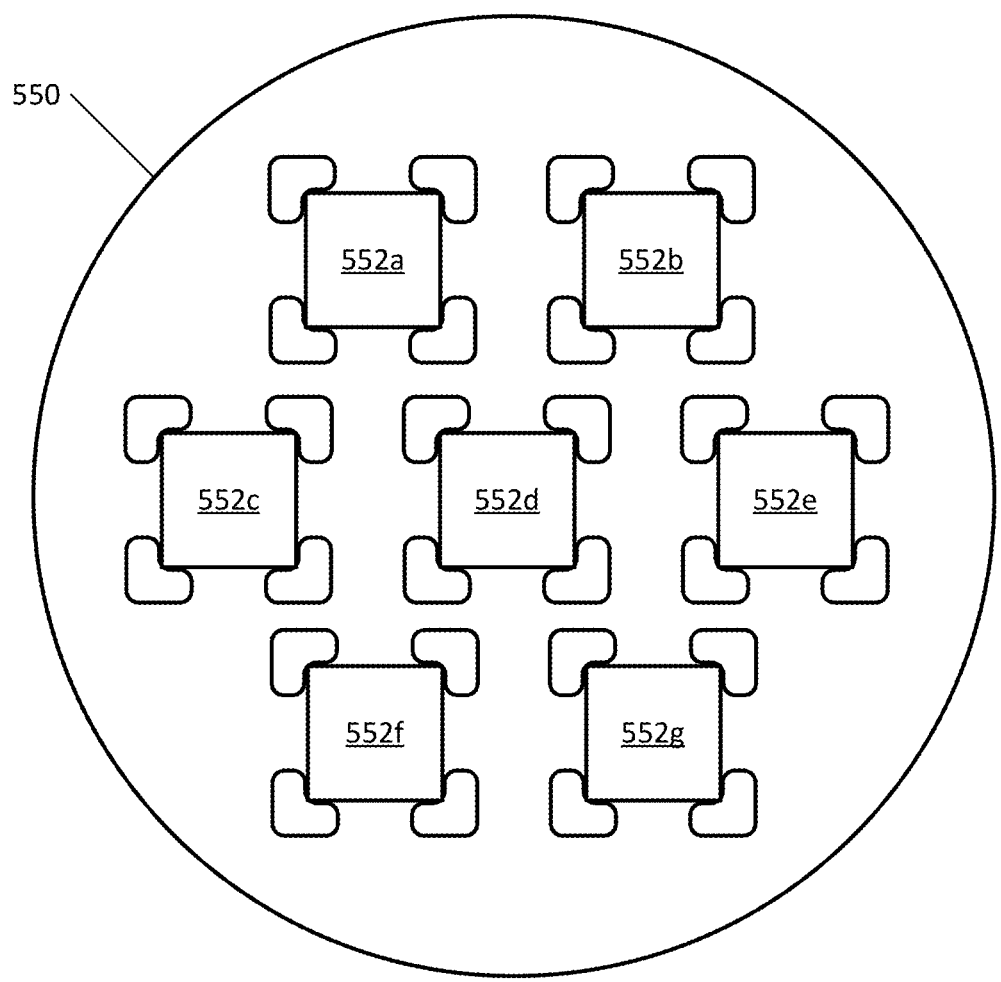
FIG. 5C is an example test wafer with a plurality of coupon holder assemblies.

Referring to FIG. 5C, with further reference to FIGS. 5A and 5B, an example test wafer 550 with a plurality of coupon holder assemblies 552a-g is shown. The test wafer 550 may be a 300 mm wafer, other wafer size based on the capabilities of a deposition system. The number of locations of the coupon holder assemblies 552a-g are examples only, and not limitations. The number and locations of the individual coupon holder assemblies 552a-g may vary. For example, the locations of the coupon holder assemblies 552a-g may be aligned with the capabilities of a combinatorial processing system such as a quadrant-based ALD system. With such a system, some of the coupon holder assemblies 552a-g may be disposed to align with quadrant chambers. Other combinatorial processing chambers may also be used. In an embodiment, the test wafer 550 may serve as the first substrate 302 such that the spacers 304 are disposed in areas directly on the test wafer 550 and the second substrate 306 is disposed on the spacers 304 as previously described. In an embodiment, the corner holders 502a-d may also be the spacers 304.

Figure 6:
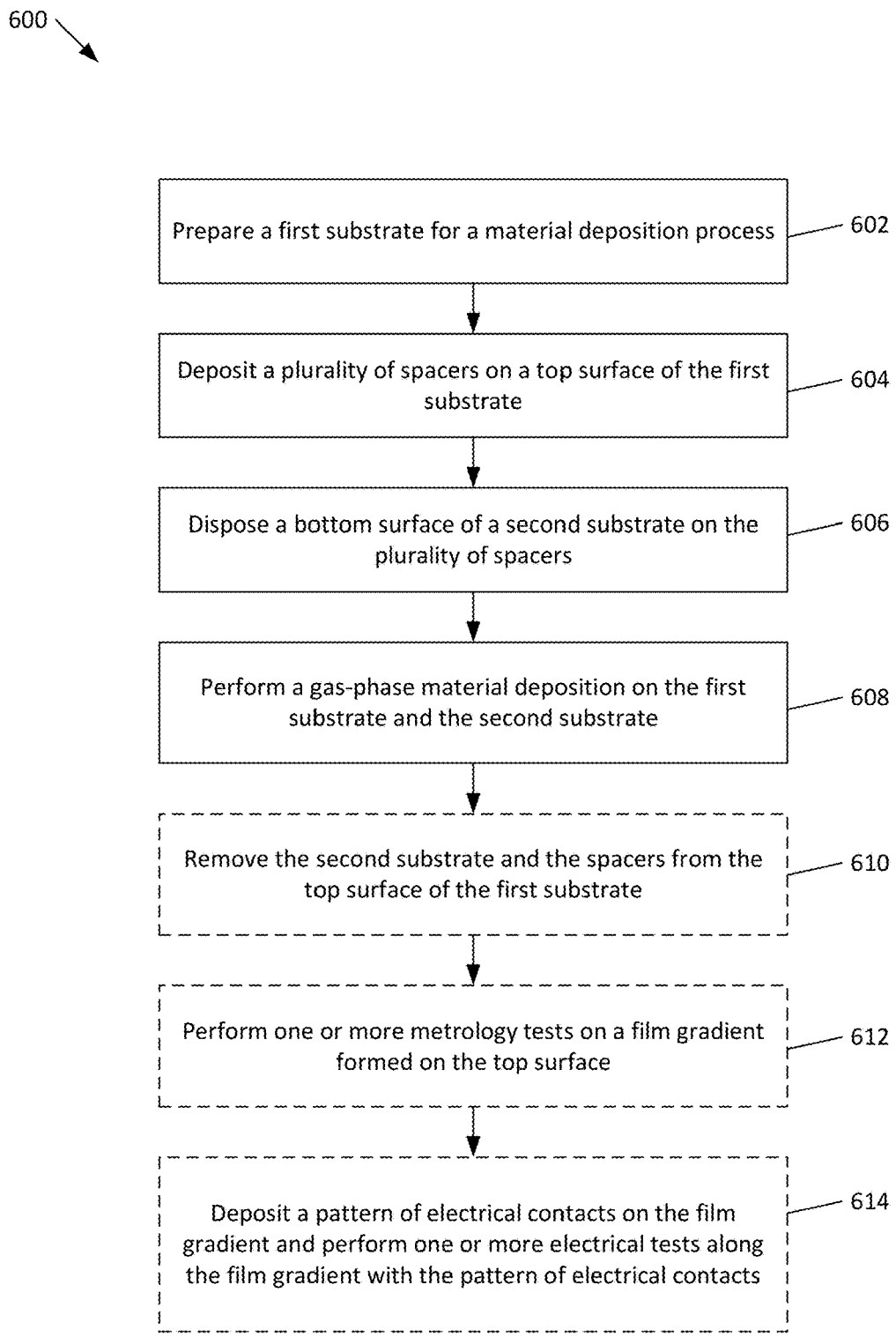
FIG. 6 is an example method for thin film deposition in a high aspect ratio feature.

Referring to FIG. 6, with further reference to FIGS. 1-5C, a method 600 for thin film deposition in a high aspect ratio feature includes the stages shown. The method 600 is, however, an example only and not limiting. The method 600 may be altered, e.g., by having stages added, removed, rearranged, combined, performed concurrently, and/or having single stages split into multiple stages. For example, stages 610, 612, and 614 are optional as metrology and electrical test requirements may vary based on device design requirements. Still other alterations to the method 600 as shown and described are possible.

At stage 602 the method includes preparing a first substrate for a material deposition process. In an example, a coupon may be the first substrate 302. In an example, an area on a test wafer 550 may be the first substrate. The first substrate may be comprised of silicon (pure or doped), germanium, a III-V semiconductor (e.g., elements in groups III and V of the periodic table), or other material used in semiconductor processing, and preparing the substrate may include cleaning and planarization steps as known in the art prior to deposition. Preparing the substrate may include coating the substrate with a metal or oxide layer to simulate the surface of a production wafer immediately prior to a gas-phase deposition process. For example, the substrate may be oxidized (e.g. to form a silicon oxide layer on a silicon substrate) or coated with an insulator (e.g. silicon oxide, silicon nitride, aluminum oxide, hafnium oxide, etc.), a semiconductor (e.g. polycrystalline silicon), a conductor (e.g. platinum, gold, titanium nitride, etc.), or another material. A substrate coupon, such as the first substrate 302, may be disposed on a test wafer 550 and secured in place with a coupon holder assembly such as the corner holders 502a-d.

At stage 604 the method includes depositing a plurality of spacers on a top surface of the first substrate. The plurality of spacers may be microspheres of a size in a range of 10 to 100 microns. In an example, a size of microspheres may be mixed with a solvent such as isopropyl alcohol to form a slurry. A drop of the slurry mixture may be place on each corner of the first substrate. A pipette or other liquid dispensing device may be a means for depositing a plurality of spheres on a substrate. Generally, the size of the spacers may be varied to enable deposition in or near the molecular flow regime (i.e., the mean free path of reactant gas molecules may be larger than the spacing between surfaces) for comparison with thin film deposition conditions in nanoscale devices. The thin film deposition process and spacer size may also be tuned to control the extent of deposition of the film into the high aspect ratio space created between the first substrate and a second substrate disposed above the first substrate.

At stage 606 the method includes disposing a bottom surface of a second substrate on the plurality of spacers. In an example, a wafer handling system may be a means for depositing the bottom surface of the second substrate on the plurality of spacers. The second substrate 306 may be composed of a flat material, such as a silicon wafer. At least one of the top surface of the first substrate 302 and the bottom surface of the second substrate 306 may be considered as the substrate for a thin film deposition process. The second substrate 306 may also consist of a bulk material (e.g., pure or doped silicon, germanium, a III-V semiconductor, etc.) which may be coated with an insulator (e.g. silicon oxide, silicon nitride, aluminum oxide, hafnium oxide, etc.), a semiconductor (e.g. polycrystalline silicon), a conductor (e.g. platinum, gold, titanium nitride, etc.) or another material. The volume between the top surface of the first substrate 302 and the bottom surface of the second substrate 306 defines a high aspect feature with a width equal to the thickness (e.g., size, diameter) of the spacers. The stack of the first substrate 302, spacers 304, and second substrate may be disposed on the test wafer 550 within a coupon holder assembly 552a-g.

At stage 608 the method includes performing a gas-phase material deposition on the first substrate and the second substrate. Gas-phase material deposition processes such as ALD, PVD, CVD, LPCVD, PECVD, PEALD, or MOCVD may be a means used to deposit a coating in the high aspect feature created between first and second substrates. For example, the substrates 302, 306 and the spacers 304 may be disposed in the process chamber 102 in the example system 100. The process variables such as precursor 112 and reactant 114 composition, carrier gas 110 flow rate, chamber temperature, pressure, and processing time may be set to values that may be used in a device processing recipe. The thin film deposition process parameters may be tuned to control the extent of deposition of the film into the high aspect ratio space. Because of limitations in thin film deposition (e.g. gas diffusion, reactant dose, surface chemistry, etc.), a gradient of the film properties (e.g. thickness, composition, defect density, etc.) may result. In an embodiment, a plurality of substrates 302, 306 may be placed in a combinatorial processing system such that each of the plurality of substrates 302, 306 undergoes a different gas-phase deposition process.

At stage 610 the method may optionally include removing the second substrate and the spacers from the top surface of the first substrate. In an example, the first and second substrate 302, 306 may be removed from the gas-phase deposition process 308, and the second substrate 306 and the spacers 304 may be removed from the top surface of the first substrate 302 to expose a resulting thin film 310 that extends inward in a gradient from the edge towards the center of the first substrate 302. In an example, the spacers 304 may be removed by blowing the surface of substrate 302 with a jet of dry air or nitrogen.

At stage 612 the method may optionally include performing one or more metrology tests on a film gradient formed on the top surface. A thin film gradient deposited in the gas-phase material deposition process at stage 608 enables the study of changes in the properties of thin films across a film gradient caused by limitations in thin film deposition in high aspect ratio spaces. The metrology tests may provide insight into the physical and functional properties of thin films deposited in high aspect ratio spaces. In general, such testing may not otherwise be available for real nanoscale devices because standard metrological instruments often cannot access the corresponding small device size and device geometry. Physical properties which may change along the film gradient and may be measured on the thin film gradient using standard laboratory metrology tools (i.e., with probe sizes on the order of hundreds of microns or larger). For example, the properties such as film thickness (e.g., ellipsometry, X-ray reflectivity), crystal structure (e.g., X-ray diffraction, optical spectroscopy), crystallite size (e.g., X-ray diffraction, scanning probe microscopy), and composition (e.g., X-ray fluorescence, energy-dispersive X-ray spectroscopy, X-ray photoelectron spectroscopy) may be measured.

At stage 614 the method may optionally include depositing a pattern of electrical contacts on the film gradient and performing one or more electrical tests along the film gradient with the pattern of electrical contacts. In general, additional physical or chemical treatment, such as thermal processing in a specified chemical environment (e.g. inert gas (nitrogen, argon) or forming gas (hydrogen diluted in an inert gas)) may be required prior to depositing the pattern of electrical contacts. Such treatments may occur after thin film deposition and before top contact deposition, or after top contact deposition. The pattern of electrical contacts may be the array of electrical contacts 312. The size of each of the contact pads in the array of electrical contacts 312 is typically in the range of 100-500 microns and spaced 200-1200 microns from one another. The contact pads may be electrical contacts deposited onto the film in a pattern to form the top contacts of devices (e.g. metal-insulator-metal capacitor structures or metal-insulator-semiconductor structures), enabling electrical testing across the film gradient.

In an embodiment, the bottom surface of the second substrate 306 may also include a thin film gradient and the testing described at stages 612 and 614 may be performed on the second substrate 306.

Other examples and implementations are within the scope and spirit of the disclosure and appended claims.

Also, as used herein, "or" as used in a list of items prefaced by "at least one of" or prefaced by "one or more of" indicates a disjunctive list such that, for example, a list of "at least one of A, B, or C," or a list of "one or more of A, B, or C," or "A, B, or C, or a combination thereof" means A or B or C or AB or AC or BC or ABC (i.e., A and B and C), or combinations with more than one feature (e.g., AA, AAB, ABBC, etc.).

As used herein, unless otherwise stated, a statement that a function or operation is "based on" an item or condition means that the function or operation is based on the stated item or condition and may be based on one or more items and/or conditions in addition to the stated item or condition.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known processes, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, some operations may be performed in parallel or concurrently. In addition, the order of the operations may be rearranged. A process may have additional stages or functions not included in the figure.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of operations may be undertaken before, during, or after the above elements are considered. Accordingly, the above description does not bound the scope of the claims.

"About" and/or "approximately" as used herein when referring to a measurable value such as an amount, a temporal duration, and the like, encompasses variations of ±20% or ±10%, ±5%, or +0.1% from the specified value, as appropriate in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as appropriate in the context of the systems, devices, circuits, methods, and other implementations described herein.

Further, more than one invention may be disclosed.

The invention claimed is:

1. A method for thin film deposition in a high aspect ratio feature, comprising:
    preparing a first substrate for a material deposition process;
    depositing a plurality of spacers on a top surface of the first substrate;
    disposing a bottom surface of a second substrate on the plurality of spacers;
    performing a gas-phase material deposition on the first substrate and the second substrate,
    removing the second substrate and the plurality of spacers from the top surface of the first substrate; and
    performing one or more metrology tests on a film gradient formed on the top surface of the first substrate.

2. The method of claim 1 wherein the one or more metrology tests include at least one of ellipsometry, X-ray reflectivity, X-ray diffraction, optical spectroscopy, scanning probe microscopy, X-ray fluorescence, energy-dispersive X-ray spectroscopy, and X-ray photoelectron spectroscopy.

3. The method of claim 1 further comprising
    depositing a pattern of electrical contacts on a film gradient formed on the top surface of the first substrate; and
    performing one or more electrical tests along the film gradient with the pattern of electrical contacts.

4. The method of claim 1 wherein the plurality of spacers are a plurality of spheres.

5. The method of claim 4 wherein a diameter of each of the plurality of spheres are approximately equal and in a range of 10 to 100 microns.

6. The method of claim 1 wherein the first substrate is an area on a test wafer.

7. The method of claim 1 wherein the first substrate is a coupon measuring approximately 40-50 mm in length and width.

8. The method of claim 7 further comprising disposing the first substrate on a test wafer including a plurality of coupon holders configured to hold the first substrate and the second substrate in a position on the test wafer.

9. The method of claim 1 wherein the first substrate is comprised of at least one of pure silicon, doped silicon, germanium, glass, quartz, sapphire, and a III-V semiconductor.

10. The method of claim 1 wherein preparing the first substrate for the material deposition process includes coating the first substrate with an insulator, a semiconductor, or a conductor.

11. The method of claim 1 wherein performing the gas-phase material deposition on the first substrate and the second substrate includes performing an atomic layer deposition process.

\* \* \* \* \*